United States Patent
Tian et al.

(10) Patent No.: US 10,451,944 B2
(45) Date of Patent: Oct. 22, 2019

(54) ARRAY SUBSTRATE AND METHOD FOR MANUFACTURING THE SAME, AND DISPLAY DEVICE

(71) Applicant: BOE TECHNOLOGY GROUP CO., LTD., Beijing (CN)

(72) Inventors: Yunyun Tian, Beijing (CN); Hui Zhang, Beijing (CN); Hyun Sic Choi, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/580,637

(22) PCT Filed: Apr. 27, 2017

(86) PCT No.: PCT/CN2017/082198
§ 371 (c)(1),
(2) Date: Dec. 7, 2017

(87) PCT Pub. No.: WO2017/190624
PCT Pub. Date: Nov. 9, 2017

(65) Prior Publication Data
US 2018/0188625 A1     Jul. 5, 2018

(30) Foreign Application Priority Data

May 3, 2016    (CN) .......................... 2016 1 0286426

(51) Int. Cl.
*H01L 27/12* (2006.01)
*H01L 21/77* (2017.01)
(Continued)

(52) U.S. Cl.
CPC ...... *G02F 1/136286* (2013.01); *G02F 1/1368* (2013.01); *G02F 1/134309* (2013.01);
(Continued)

(58) Field of Classification Search
CPC ....... H01L 21/77; H01L 27/12; H01L 27/124; H01L 27/1259; G02F 1/136286;
(Continued)

(56) References Cited

U.S. PATENT DOCUMENTS 6,259,503 B1 * 7/2001 Watanabe ......... G02F 1/134363
349/129
6,611,310 B2 * 8/2003 Kurahashi ......... G02F 1/133553
349/138
(Continued)

FOREIGN PATENT DOCUMENTS

CN    1607439 A     4/2005
CN    102315165 A    1/2012
(Continued)

OTHER PUBLICATIONS

International Search Report & Box V of Written Opinion, for PCT Patent Application No. PCT/CN2017,082198, dated Jun. 30, 2017, 6 pages.

*Primary Examiner* — Ida M Soward
(74) *Attorney, Agent, or Firm* — Kinney & Lange, P.A.

(57) ABSTRACT

Embodiments of the disclosure provide an array substrate and a method for manufacturing the array substrate. The array substrate includes a substrate, a first electrode disposed on the base substrate and a second electrode disposed on the base substrate and located in a different layer from the first electrode with an insulation layer being disposed therebetween, wherein each of the first and second electrodes is a comb-like electrode, and the first and second electrodes are configured to generate an electric field therebetween when being applied with a voltage.

17 Claims, 6 Drawing Sheets

(51) Int. Cl.
  *G02F 1/13* (2006.01)
  *G02F 1/1362* (2006.01)
  *G02F 1/1343* (2006.01)
  *G02F 1/1368* (2006.01)
  *G02F 1/1333* (2006.01)

(52) U.S. Cl.
  CPC .. *G02F 1/134363* (2013.01); *G02F 1/136227* (2013.01); *H01L 27/124* (2013.01); *H01L 27/1259* (2013.01); *G02F 1/1333* (2013.01); *G02F 1/1362* (2013.01); *G02F 2001/13625* (2013.01); *G02F 2001/136295* (2013.01); *G02F 2201/124* (2013.01); *H01L 21/77* (2013.01); *H01L 27/12* (2013.01)

(58) Field of Classification Search
  CPC ............ G02F 1/1333; G02F 1/134363; G02F 1/1362; G02F 1/136227; G02F 1/1368
  See application file for complete search history.

(56) References Cited

U.S. PATENT DOCUMENTS

| | | | | |
|---|---|---|---|---|
| 6,646,283 | B1* | 11/2003 | Akimoto | H01L 29/78642 257/23 |
| 7,304,706 | B2* | 12/2007 | Mizoguchi | G02F 1/134363 349/139 |
| 8,496,842 | B2* | 7/2013 | Udayakumar | H01L 27/20 216/66 |
| 9,285,619 | B2* | 3/2016 | Yamayoshi | G02F 1/13452 |
| 9,740,061 | B2* | 8/2017 | Wang | G02F 1/134363 |
| 2002/0008796 | A1 | 1/2002 | Kung | |
| 2006/0205103 | A1* | 9/2006 | Tamura | B82Y 10/00 438/30 |
| 2006/0267891 | A1* | 11/2006 | Nishimura | G02F 1/133555 345/87 |
| 2008/0002079 | A1* | 1/2008 | Kimura | G02B 6/0051 349/42 |
| 2008/0218646 | A1* | 9/2008 | Miyachi | G02F 1/134363 349/37 |
| 2008/0265339 | A1* | 10/2008 | Komatsu | H01L 27/0805 257/401 |
| 2011/0128458 | A1* | 6/2011 | Morishita | G02F 1/134363 349/33 |
| 2012/0141694 | A1* | 6/2012 | Matsumoto | C09K 19/3402 428/1.1 |
| 2014/0204325 | A1* | 7/2014 | Kimura | G02F 1/134363 349/140 |
| 2014/0240651 | A1* | 8/2014 | Yoshioka | G02F 1/134363 349/141 |
| 2015/0370369 | A1* | 12/2015 | Kuo | G06F 3/044 345/174 |
| 2016/0041414 | A1* | 2/2016 | Shen | H01L 27/12 257/72 |
| 2016/0147123 | A1* | 5/2016 | Cheng | G02F 1/134363 257/72 |
| 2016/0204189 | A1* | 7/2016 | Sin | H01L 28/60 257/532 |
| 2017/0358601 | A1* | 12/2017 | Kim | H01L 21/77 |
| 2018/0019345 | A1* | 1/2018 | Ishitani | G02F 1/133514 |

FOREIGN PATENT DOCUMENTS

| | | |
|---|---|---|
| CN | 102723309 A | 10/2012 |
| CN | 102903675 A | 1/2013 |
| CN | 103294246 A | 9/2013 |
| CN | 104950532 A | 9/2015 |
| CN | 105278180 A | 1/2016 |
| CN | 105826328 A | 8/2016 |
| JP | 110260431 A | 9/1998 |

* cited by examiner

ARRAY SUBSTRATE AND METHOD FOR MANUFACTURING THE SAME, AND DISPLAY DEVICE

CROSS-REFERENCE TO RELATED APPLICATION

This application claims the benefit of Chinese Patent Application No. 201610286426.7 filed on May 3, 2016 in the State Intellectual Property Office of China, the whole disclosure of which is incorporated herein by reference.

BACKGROUND OF THE DISCLOSURE

Field of the Disclosure

Embodiments of the disclosure generally relate to the field of display technologies, and in particular to an array substrate and a method for manufacturing the same, and a display device.

Description of the Related Art

A liquid crystal display device is the most mainstream display device in the field of display technologies. According to an arrangement of liquid crystal molecules, the liquid crystal display device may be classified into a Twisted Nematic (TN) type, an In-Plane Switching (IPS) type, a Vertical Alignment (VA) and the like. The IPS type liquid crystal display device has advantages such as wide viewing angle, fast response speed accurate color reproduction and the like, and has drawn wide attention in the field.

SUMMARY OF THE DISCLOSURE

An object of the disclosure is to provide an array substrate and a method for manufacturing the same, and a display device, so as to at least solve the problem of low light transmittance of an array substrate with a comb-like electrode structure.

According to one aspect of the disclosure, there is provided an array substrate, comprising: a base substrate; a first electrode disposed on the base substrate; and a second electrode disposed on the base substrate and located in a different layer from the first electrode with an insulation layer being disposed therebetween; each of the first and second electrodes is a comb-like electrode, and the first and second electrodes are configured to generate an electric field therebetween when being applied with a voltage.

In an exemplary embodiment of the disclosure, the comb-like electrode comprises a comb handle part and a comb teeth part having a plurality of comb teeth, and orthographic projections of the plurality of comb teeth of the first electrode on the base substrate are arranged to alternate with orthographic projections of the plurality of comb teeth of the second electrode on the base substrate.

In an exemplary embodiment of the disclosure, an orthographic projection of at least one of the plurality of comb teeth of the first electrode on the base substrate is located between orthographic projections of two adjacent ones of the comb teeth of the second electrode on the base substrate, and/or an orthographic projection of at least one of the plurality of comb teeth of the second electrode on the base substrate is located between orthographic projections of two adjacent ones of the comb teeth of the first electrode on the base substrate.

In an exemplary embodiment of the disclosure, a minimum distance between an orthographic projection of the comb handle part of the second electrode on the base substrate and end portions of the orthographic projections of the plurality of comb teeth of the first electrode on the base substrate is less than 6 μm, and/or a minimum distance between an orthographic projection of the comb handle part of the first electrode on the base substrate and end portions of the orthographic projections of the plurality of comb teeth of the second electrode on the base substrate is less than 6 μm.

In an exemplary embodiment of the disclosure, end portions of the orthographic projections of the plurality of comb teeth of the first electrode on the base substrate are at least partially overlapped with the orthographic projection of the comb handle part of the second electrode on the base substrate, and/or, end portions of the orthographic projections of the plurality of comb teeth of the second electrode on the base substrate are at least partially overlapped with the orthographic projection of the comb handle part of the first electrode on the base substrate.

In an exemplary embodiment of the disclosure, an orthographic projection of the insulation layer located over the first electrode on the base substrate is completely overlapped with an orthographic projection of the first electrode on the base substrate, or an area of an orthographic projection of the insulation layer located over the first electrode on the base substrate is slightly greater than an area of an orthographic projection of the first electrode on the base substrate.

In an exemplary embodiment of the disclosure, the array substrate further comprises a gate insulation layer disposed below the first electrode, and the first and second electrodes are located on different surfaces.

In an exemplary embodiment of the disclosure, the first electrode is a pixel electrode while the second electrode is a common electrode, or the first electrode is a common electrode while the second electrode is a pixel electrode.

According to another aspect of the disclosure, there is provided a method for manufacturing an array substrate, comprising steps of: forming a first conductive thin film and a layer of insulation film on a base substrate sequentially; patterning the layer of insulation film and the first conductive thin film so as to form patterns of an insulation layer and a first electrode; forming a second conductive thin film on the base substrate having the patterns of the insulation layer and the first electrode; and removing, through a single patterning process, a portion of the second conductive thin film outside a second electrode region to be formed, so as to form a pattern of a second electrode.

In an exemplary embodiment of the disclosure, the step of patterning the layer of insulation film and the first conductive thin film so as to form patterns of an insulation layer and a first electrode comprises:

forming a photoresist layer having the same pattern as that of the first electrode to be formed over the layer of insulation film;

etching, by using the photoresist layer as a mask, a portion of the layer of insulation film outside the first electrode region to be formed, so as to form a pattern of the insulation layer; and etching, by using the photoresist layer as a mask, a portion of the first conductive thin film outside the first electrode region to be formed, so as to form a pattern of the first electrode.

In an exemplary embodiment of the disclosure, the method further comprises forming a gate insulation material layer on the base substrate before forming the first conductive thin film.

In an exemplary embodiment of the disclosure, the method further comprises etching, by using the photoresist layer as a mask, a portion of the gate insulation material layer outside the first electrode region to be formed, so as to form a pattern of a gate insulation layer below the pattern of the first electrode, after forming the pattern of the first electrode and before forming the second conductive thin film.

In an exemplary embodiment of the disclosure, each of the first and second electrodes is a comb-like electrode comprising a comb handle part and a comb teeth part having a plurality of comb teeth, and orthographic projections of the plurality of comb teeth of the first electrode on the base substrate are arranged to alternate with orthographic projections of the plurality of comb teeth of the second electrode on the base substrate.

In an exemplary embodiment of the disclosure, an orthographic projection of at least one of the plurality of comb teeth of the first electrode on the base substrate is located between orthographic projections of two adjacent ones of the comb teeth of the second electrode on the base substrate, and/or an orthographic projection of at least one of the plurality of comb teeth of the second electrode on the base substrate is located between orthographic projections of two adjacent ones of the comb teeth of the first electrode on the base substrate.

In an exemplary embodiment of the disclosure, a minimum distance between an orthographic projection of the comb handle part of the second electrode on the base substrate and end portions of the orthographic projections of the plurality of comb teeth of the first electrode on the base substrate is less than 6 μm, and/or a minimum distance between an orthographic projection of the comb handle part of the first electrode on the base substrate and end portions of the orthographic projections of the plurality of comb teeth of the second electrode on the base substrate is less than 6 μm.

In an exemplary embodiment of the disclosure, end portions of the orthographic projections of the plurality of comb teeth of the first electrode on the base substrate are at least partially overlapped with the orthographic projection of the comb handle part of the second electrode on the base substrate; and/or end portions of the orthographic projections of the plurality of comb teeth of the second electrode on the base substrate are at least partially overlapped with the orthographic projection of the comb handle part of the first electrode on the base substrate.

In an exemplary embodiment of the disclosure, an orthographic projection of a insulation layer located over the first electrode on the base substrate is completely overlapped with an orthographic projection of the first electrode on the base substrate, or an area of an orthographic projection of the insulation layer located over the first electrode on the base substrate is slightly greater than an area of an orthographic projection of the first electrode on the base substrate.

In an exemplary embodiment of the disclosure, the method further comprises: forming patterns of a gate electrode and a gate line on the base substrate by a single patterning process before forming the first conductive thin film; and forming patterns of an active layer, a source electrode, a drain electrode and a data line on the base substrate having the pattern of the gate electrode by a single patterning process.

According to further another aspect of the disclosure, there is provided a display device comprising the array substrate according to any one of the embodiments of the disclosure or the array substrate manufactured by the method according to any one of the embodiments of the disclosure.

BRIEF DESCRIPTION OF THE DRAWINGS

In order to clearly describe technical solutions of embodiments of the disclosure, the accompanying drawings used for describing the embodiments or the prior arts are simply introduced below. Obviously, the accompanying drawings described below are merely some embodiments of the disclosure, and those skilled in the art may arrive at other accompanying drawings based on these drawings without any inventive steps.

FIG. 3 shows a structure in which a gate insulation material layer, a first conductive thin film and a layer of insulation film are sequentially formed on a substrate;

FIG. 4A shows a structure in which a photoresist layer is formed on the structure shown in FIG. 3;

FIG. 4B shows a structure in which the photoresist layer and the layer of insulation film shown in FIG. 4A are etched;

FIG. 4C shows a structure in which the first conductive thin film shown in FIG. 4B is etched;

FIG. 4D shows a structure in which the gate insulation material layer shown in FIG. 4C is etched;

FIG. 4E shows a structure in which the photoresist layer shown in FIG. 4D is removed;

FIG. 5 shows a structure in which a second conductive thin film is formed on the structure shown in FIG. 4E;

FIG. 6 shows a structure in which the second conductive thin film shown in FIG. 5 is etched;

DETAILED DESCRIPTION OF PREFERRED EMBODIMENTS OF THE DISCLOSURE

In order to make the above objections, features and advantages of the disclosure more comprehensible, the technical solution of the disclosure will be fully and clearly described with reference to the accompanying drawings in embodiments thereof. The embodiments as described obviously merely a part of embodiments of the disclosure, rather than being all embodiments thereof. All other embodiments obtained by those ordinary skilled in the art without any inventive step based on the embodiments of the disclosure will fall within the scope of the disclosure.

Figure 1:
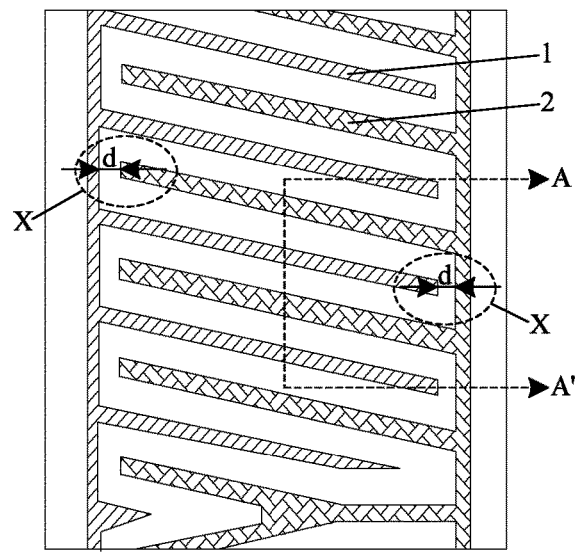
FIG. 1 is a structural top view of a pixel electrode and a common electrode of an array substrate.
Figure 2:
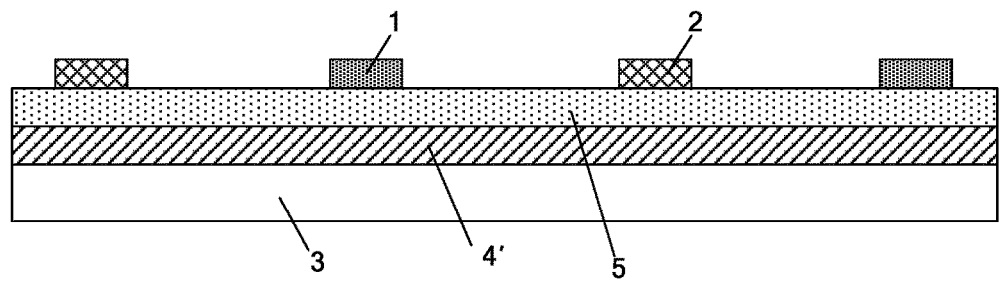
FIG. 2 is a cross-sectional view of FIG. 1 taken along the dotted line A-A'.

An array substrate of an IPS liquid crystal display device has a variety of structures, one of which may be manufactured by four patterning processes including a first patterning process for preparing a gate electrode and gate lines, a second patterning process for preparing an active layer, a source electrode, a drain electrode and data lines, a third patterning process for preparing a via hole in a insulation layer and a fourth patterning process for preparing a pixel electrode and a common electrode. In an example, as shown in FIGS. 1 and 2, each of a pixel electrode 1 and a common electrode 2 prepared in the fourth patterning process is a comb-shaped electrode comprising a comb teeth part including a plurality of comb teeth and a comb handle part. The comb handle part extends in a direction substantially perpendicular to a direction in which each tooth of the comb teeth part extends. The plurality of comb teeth included in the comb teeth part of the pixel electrode 1 are arranged alternately with the plurality of comb teeth included in the comb teeth part of the common electrode 2. However, the array substrate having the above structure has a problem of low light transmittance.

The inventors of the disclosure have found through studies that one of reasons for the above problems lies in that: as shown in FIGS. 1 and 2, the pixel electrode 1 and the common electrode 2 are formed in a same patterning process, thus when an electrode material between the pixel electrode 1 and the common electrode 2 is etched to form patterns of the pixel electrode 1 and the common electrode 2, the electrode material would be remained between the pixel electrode 1 and the common electrode 2 due to limitations on a process capability, such residual issue of the electrode material is particularly serious at ends of the comb teeth part of each of the pixel electrode 1 and the common electrode 2, i.e. at a position denoted by X in FIG. 1. If a gap d between the pixel electrode 1 and the common electrode 2 at the position X is too small, a large amount of electrode material will be remained between them at the position X, resulting in incomplete separation of the pixel electrode 1 from the common electrode 2, thereby generating crosstalk between signals on the pixel electrode 1 and the common electrode 2. In order to avoid the signal crosstalk caused by the residual electrode material, the gap d should be large enough to completely separate the pixel electrode 1 from the common electrode 2. Typically, the gap d should be at least 6 µm. However, the gap d at the position X would result in a disordered arrangement of liquid crystal molecules so that the liquid crystal molecules can not be deflected into place, that is, the liquid crystal efficiency is low, so that the light transmittance is decreased. The larger the gap d is, the more serious the problem is. In a case that the gap d is 6 µm, the light transmittance of the array substrate is only 86.3% of that of an array substrate having no gap between the pixel electrode and the common electrode.

Figure 3:
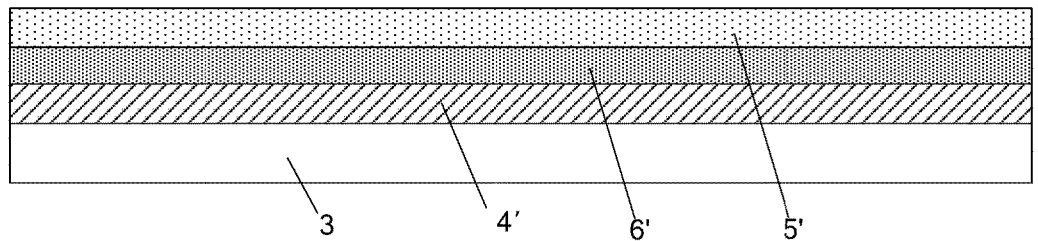
FIGS. 3, 4A to 4E, 5 and 6 are schematic cross-sectional views illustrating structures formed after respective steps of a method for manufacturing an array substrate according to an embodiment of the disclosure, where.

Based on the above research results, embodiments of the disclosure provide a method for manufacturing an array substrate. As shown in FIGS. 3, 4A to 4E, 5 and 6, the method comprises following steps:

Step S1: as shown in FIG. 3, forming a first conductive thin film 6' and a layer of insulation film 5' on a base substrate 3 sequentially. In one exemplary example, the first conductive thin film 6' is made of a transparent conductive material such as ITO (Indium Tin Oxide), IZO (Indium Zinc Oxide), or the like. In this step, a sequence of forming the first conductive thin film 6' and the layer of insulation film 5' is changed. That is, a conventional sequence in which the insulation layer 5 is firstly formed and the pixel electrode 1 and the common electrode 2 are then formed is changed into a sequence in which the first conductive thin film 6' and the layer of insulation film 5' are firstly formed in order that in the subsequent steps, a step of forming a first electrode and a step of forming a insulation layer are combined into a single patterning process and the step of forming the first electrode is separated from a step of forming a second electrode so that the step of forming the first electrode and the step of forming the second electrode are completed in two patterning processes.

It is noted that the method for manufacturing the array substrate according to this embodiment may further comprise a step of forming a gate insulation material layer 4' on the base substrate 3 before forming the first conductive thin film 6, that is, before step S1. In addition, the method may further comprise a step of forming patterns of a gate electrode and gate lines before forming the gate insulation material layer 4' by a single patterning process. The method may further comprise a step of forming patterns of an active layer, a source electrode, a drain electrode and data lines by a single patterning process after forming the gate insulation material layer 4' and before forming the first conductive thin film 6'. A mask used in the patterning process may be a half grayscale mask. The formed gate electrode, the active layer, the source electrode and the drain electrode will form a thin film transistor.

Step S2: patterning the layer of insulation film and the first conductive thin film so as to form patterns of an insulation layer 5 and a first electrode 6, as shown in FIGS. 4A to 4E. In this step, the insulation layer 5 and the first electrode 6 are formed through the single patterning process. The insulation layer 5 covers over the first electrode 6. Further, in a region where the thin film transistor is located, the first electrode 5 is in direct contact with and thus electrically connected with metal layers of the source and drain electrode of the thin film transistor since no insulation layer exists between the first electrode 6 and the metal layers of the source and drain electrodes.

Figure 4A:
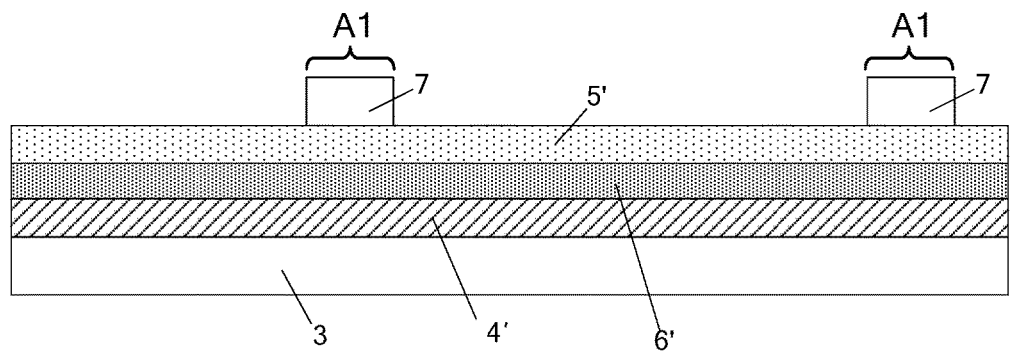
Figure 4B:
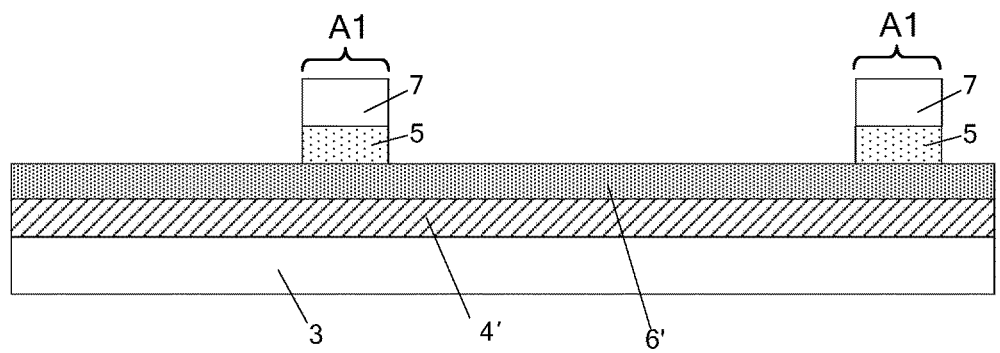
Figure 4C:
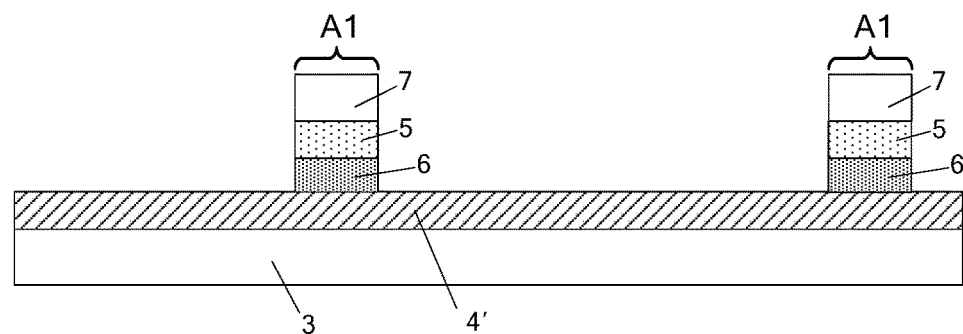
Figure 4D:
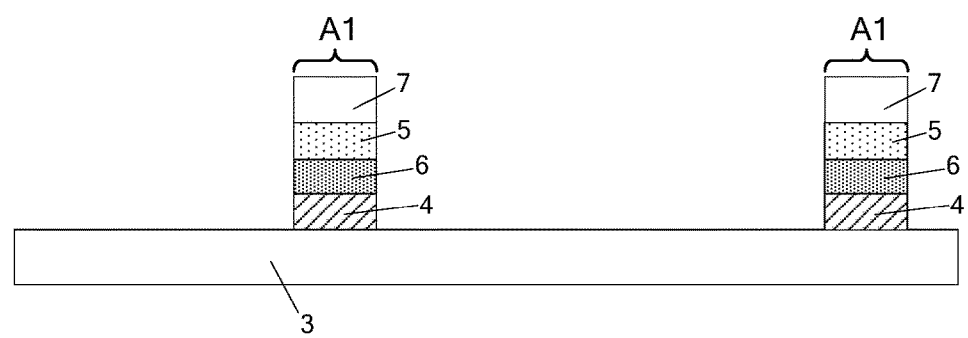

In an exemplary example, the step S2 may comprise following sub-steps S21~S25:

Sub-step 21: forming a photoresist layer 7 having the same pattern as that of the first electrode 6 to be formed on the layer of insulation film 5', as shown in FIG. 4A;

Sub-step 22: etching, by using the photoresist layer 7 as a mask, a portion of the layer of insulation film 5' outside the first electrode region A1 to be formed so that a pattern of the insulation layer 5 is formed by a portion of the layer of insulation film 5' remained within the first electrode region A1 to be formed, as shown in FIG. 4B;

Sub-step 23: etching, by using the photoresist layer 7 as a mask, a portion of the first conductive thin film 6' outside the first electrode region A1 to be formed so that a pattern of the first conductive thin film 6 is formed by a portion of the first conductive thin film remained within the first electrode region A1 to be formed, as shown in FIG. 4C;

Sub-step 24: etching, by using the photoresist layer 7 as the mask, a portion of the gate insulation material layer 4' outside the first electrode region A1 to be formed so that a pattern of the gate insulation layer 4 is formed by a portion of the gate insulation material layer remained within the first electrode region A1 to be formed, as shown in FIG. 4D. Through this step, the first electrode 6 is located on the gate insulation layer 4 within the first electrode region A1, and the subsequently formed second electrode will be directly located within a region not covered by the gate insulation layer 4, so that a height difference is formed between the first electrode 6 and the subsequent formed second electrode.

It is noted that the portion of the gate insulation material layer 4' outside the first electrode region A1 to be formed is removed to form the gate insulation layer 4 having a predetermined pattern in this step. However, the shape of the gate insulation layer 4 is not limited to this. In other embodiments of the disclosure, the sub-step 24 may also be omitted to keep the whole gate insulation layer 4.

Figure 4E:
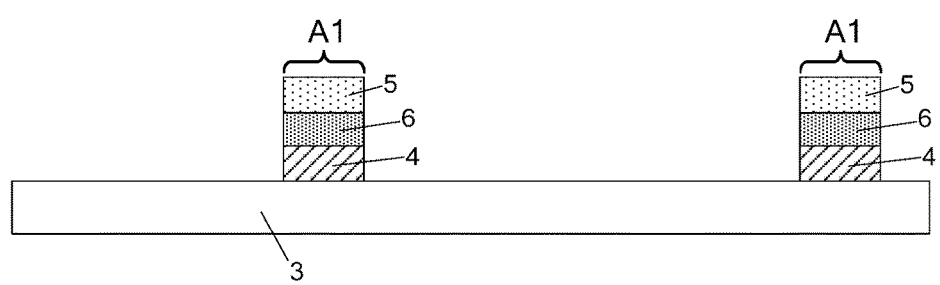

Sub-step S25: removing the photoresist layer 7 covering the insulation layer 5, as shown in FIG. 4E.

Figure 5:
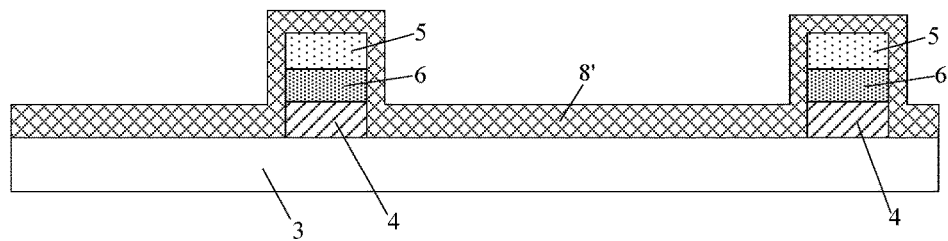

Step S3: forming a second conductive thin film 8' on the base substrate 3 having the patterns of the insulation layer 5 and the first electrode 6, as shown in FIG. 5. In an exemplary example, the second conductive thin film 8' is made of a transparent conductive material. The transparent conductive material may be, for example, ITO (Indium Tin Oxide), IZO (Indium Zinc Oxide), or the like.

Figure 6:
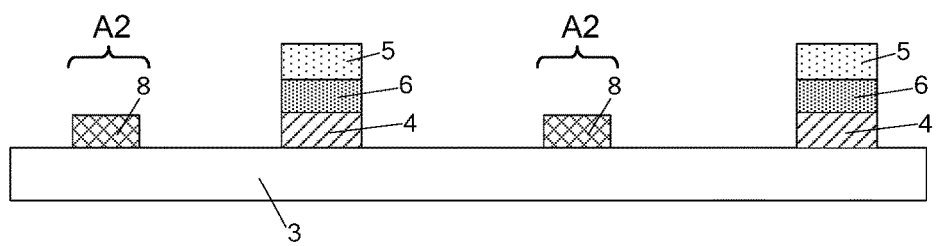

Step S4: removing, by a single patterning process, a portion of the second conductive thin film 8' outside a second electrode region A2 to be formed so as to form a pattern of the second electrode 8, as shown in FIG. 6. In this step, the second electrode 8 is formed by the single patterning process, so that the first electrode 6 and the second electrode 8 are respectively formed in two patterning processes. Although in the illustrated embodiment, the first electrode region A1 and the second electrode region A2 are shown to be spaced apart from each other and the first electrode 6 and the second electrode 8 are shown to be spaced apart from each other, in other embodiments, since the insulation layer 5 is located on the first electrode 6, overlapped portions may be formed between the first electrode 6 and the second electrode 8, and the overlapped portions are electrically insulated from each other by the insulation layer, as described below.

According to the method for manufacturing the array substrate including the above steps S1 to S4, since the first electrode 6 is firstly formed by a single patterning process and the second electrode 8 is then formed by another single patterning process, it is only necessary to remove a portion of the second conductive thin film 8' outside the second electrode A2 to be formed when electrically insulating the first electrode 6 and the second electrode 8, so that the first electrode 6 is electrically insulated from the second electrode 8 while forming the pattern of the second electrode 8. In this way, unlike the prior art, whether or not the first electrode 6 and the second electrode 8 are completely separated from each other is not limited by the process capability and is not dependent on a gap or minimum distance therebetween. That is, in the method according to the embodiments of the disclosure, it is possible to set the gap or minimum distance between the first electrode 6 and the second electrode 8 smaller while ensuring the first electrode 6 and the second electrode 8 are completely separated from each other and a signal crosstalk therebetween is within an acceptable range. Since the gap or minimum distance between the first electrode 6 and the second electrode 8 can be set smaller, it is possible to eliminate the problem of the lower light transmittance caused by a disordered alignment of liquid crystal molecules due to the larger gap, thereby effectively increasing the light transmittance of the array substrate.

Figure 7A:
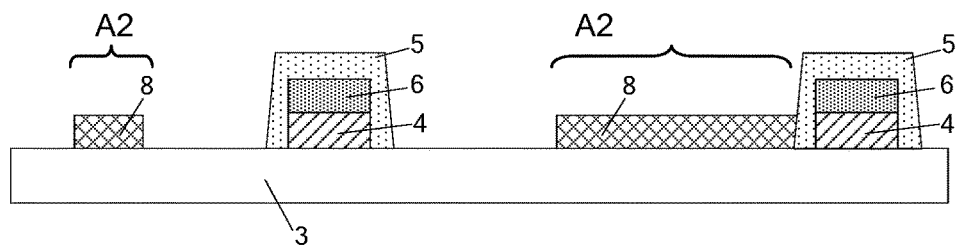
FIG. 7A is a cross-sectional view illustrating an arrangement of a pixel electrode and a common electrode of an array substrate according to an exemplary embodiment of the disclosure.
Figure 7B:
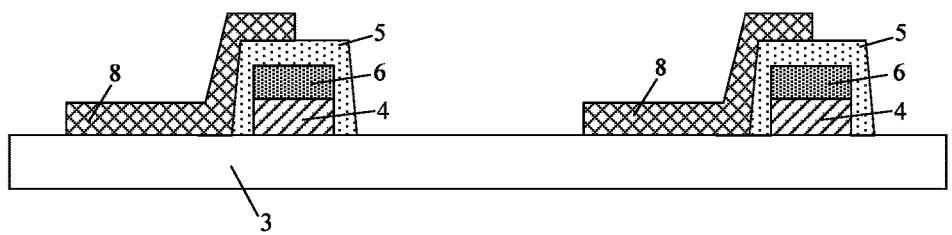
FIG. 7B is a cross-sectional view illustrating an arrangement of a pixel electrode and a common electrode of an array substrate according to another exemplary embodiment of the disclosure.

In other embodiments, as shown in FIGS. 7A and 7B, the insulation layer 5 may cover top and side surfaces of the first electrode 6. In this case, a very small distance may be formed between the second electrode 8 and the first electrode 6. For example, the second electrode 8 is in direct contact with the insulation layer 5 and is separated and electrically insulated from the first electrode 6 by the insulation layer 5, as shown in FIG. 7A. Alternatively, the second electrode 8 at least partially covers the insulation layer 5 and thus covers the first electrode 6, i.e. the second electrode 8 is at least partially overlapped with the first electrode 6, as shown in FIG. 7B.

Further, if the pattern of the gate insulation layer 4 is formed by etching the gate insulation material layer 4' as described in sub-step S24 after forming the first electrode 6 so that the height difference is formed between the first electrode 6 and the second electrode 8, the electrical insulation effect between the first electrode 6 and the second electrode 8 may be improved, so that the gap or the minimum distance therebetween can be set smaller to further eliminate the problem of the lower light transmittance caused by the gap, thereby further increasing the light transmittance of the array substrate.

Furthermore, in the method for manufacturing the array substrate according to the embodiments of the disclosure, the first electrode 6 and the insulation layer 5 are prepared by a single patterning process, and the second electrode 8 is prepared by a single patterning process. That is, the insulation layer 5, the first electrode 6 and the second electrode 8 are prepared by two patterning processes. Compared with the prior art, the number of patterning processes for preparing these film layers is not increased. Therefore, the method for manufacturing the array substrate according to the embodiments of the disclosure will not increase the number of process steps while bringing about the above-mentioned advantageous effects.

In addition, it is noted that, in the above method, since the first electrode 6 and the insulation layer 5 are formed in a same patterning process and the insulation layer 5 is located over the first electrode 6, the subsequently formed second conductive thin film 8' would not or hardly adhere to the first electrode 6, thereby ensuring that less electrode material is remained between the first electrode 6 and the second electrode 8 and the signal crosstalk therebetween due to the residual electrode material is limited within the acceptable range when the gap or minimum distance between the first electrode 6 and the second electrode 8 is smaller.

Figure 8:
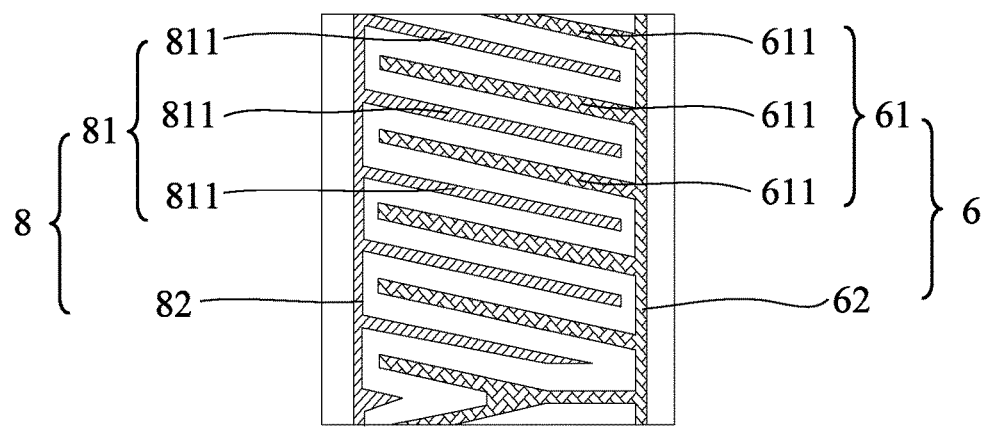
FIG. 8 is a top view illustrating structures of a pixel electrode and a common electrode of an array substrate according to an exemplary embodiment of the disclosure.

In one embodiment, as shown in FIG. 8, each of the first electrode 6 and the second electrode 8 is a comb-like electrode, and orthographic projections of the plurality of comb teeth included in the comb teeth part of the first electrode 6 on the base substrate 3 (for example, on a plane in which a surface of the base substrate, such as an upper surface or an lower surface, is located), are arranged to alternate with orthographic projections of the plurality of comb teeth included in the comb teeth part of the second electrode 8 on the base substrate 3. It is noted that the alternating arrangement herein may be implemented in various forms or patterns. For example, the plurality of comb teeth of the first electrode 6 may be divided into a plurality of first comb teeth units, each of which may include one, two or more comb teeth. Further, the plurality of comb teeth of the second electrode 8 may be divided into a plurality of second comb teeth units, each of which may include one, two or more comb teeth. Orthographic projections of the plurality of first comb teeth units on the base substrate 3 is arranged to alternate with orthographic projections of the plurality of second comb teeth units on the base substrate 3. Exemplarily, as shown in FIG. 8, an orthographic projection of at least one of the plurality of comb teeth of the first electrode 6 on the base substrate 3 is located between orthographic projections of two adjacent ones of the comb teeth of the second electrode 8 on the base substrate 3, and/or an orthographic projection of at least one of the plurality of comb teeth of the second electrode 8 on the base substrate 3 is located between orthographic projections of two adjacent ones of the comb teeth of the first electrode 6 on the base substrate 3.

Figure 9A:
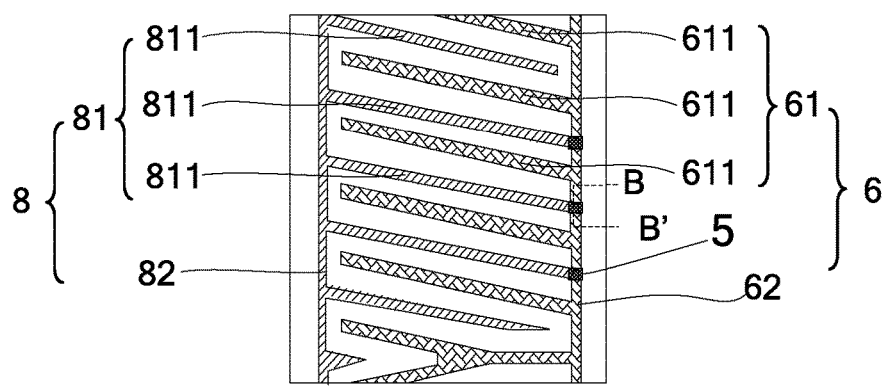
FIG. 9A is a top view illustrating structures of a pixel electrode and a common electrode of an array substrate according to another exemplary embodiment of the disclosure.
Figure 9B:
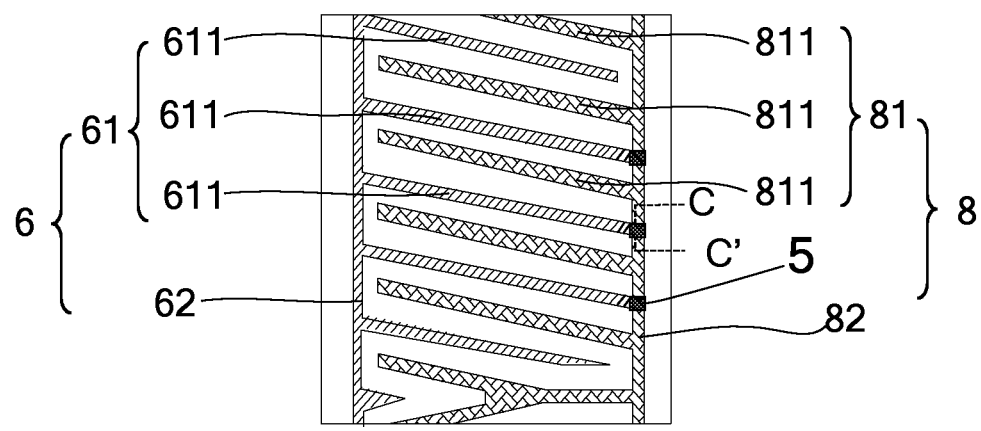
FIG. 9B is a top view illustrating structures of a pixel electrode and a common electrode of an array substrate according to still another exemplary embodiment of the disclosure.
Figure 9C:
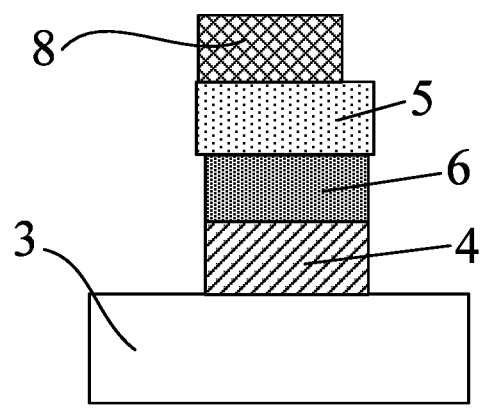
FIG. 9C is a cross-sectional view taken along the broken line B-B' in FIG. 9A or along the broken line C-C' in FIG. 9B.

In this case, the gap or minimum distance described in the above method may specifically refer to a gap or minimum distance between an orthographic projection of the comb handle part of the second electrode 8 on the base substrate 3 and end portions of the orthographic projections of the plurality of comb teeth included in the comb teeth part of the first electrode 6 on the base substrate 3, and/or a gap or minimum distance between an orthographic projection of the comb handle part of the first electrode 6 on the base substrate 3 and end portions of the orthographic projections of the plurality of comb teeth included in the comb teeth part of the second electrode 8 on the base substrate 3. In one exemplary example, the gap or minimum distance between the orthographic projection of the comb handle part of the second electrode 8 on the base substrate 3 and the end portions of the orthographic projections of the plurality of comb teeth included in the comb teeth part of the first electrode 6 on the base substrate 3 is less than 6 μm, and the gap or minimum distance between the orthographic projection of the comb handle part of the first electrode 6 on the base substrate 3 and the end portions of the orthographic projections of the plurality of comb teeth included in the comb teeth part of the second electrode 8 on the base substrate 3 is less than 6 μm. In other examples, the end portions of the orthographic projections of the plurality of comb teeth included in the comb teeth part of the first electrode 6 on the base substrate 3 are at least partially overlapped with the orthographic projection of the comb handle part of the second electrode 8 on the base substrate 3, as shown in FIGS. 9B and 9C. Alternatively, the end portions of the orthographic projections of the plurality of comb teeth included in the comb teeth part of the second electrode 8 on the base substrate 3 are at least partially overlapped with the orthographic projection of the comb handle part of the first electrode 6 on the base substrate 3, as shown in FIGS. 9A and 9C. Alternatively, the end portions of the orthographic projections of the plurality of comb teeth included in the comb teeth part of the first electrode 6 on the base substrate 3 are at least partially overlapped with the orthographic projection of the comb handle part of the second electrode 8 on the base substrate 3, and the end portions of the orthographic projections of the plurality of comb teeth included in the comb teeth part of the second electrode 8 on the base substrate 3 are at least partially overlapped with the orthographic projection of the comb handle part of the first electrode 6 on the base substrate 3. It is noted that the expression "end portions of the orthographic projections of the comb teeth on the base substrate" described herein refer to end portions of the orthographic projections of the comb teeth included in the comb teeth part of the comb-like electrode on the base substrate far away from the comb handle portion.

In the above method, the first electrode 6 may be for example a pixel electrode, and the second electrode 8 may be for example a common electrode. Alternatively, the first electrode 6 may be a common electrode and the second electrode 8 may be a pixel electrode.

According to the method for manufacturing the array substrate according to the embodiments of the disclosure, since the first electrode and the second electrode are formed in different patterning processes, the gap between the first electrode and the second electrode is not limited by the process capability and can be set smaller while the first electrode and the second electrode are completely separated from each other and the signal crosstalk therebetween is limited in the acceptable range. Further, since the first electrode and the insulation layer are formed in a same patterning process and the insulation layer is located on the first electrode, the subsequently formed second conductive thin film would not adhere to the first electrode, thereby ensuring that less electrode material is remained between the first electrode and the second electrode and the signal crosstalk therebetween due to the residual electrode material is limited within the acceptable range when the gap or minimum distance between the first electrode and the second electrode is smaller. Therefore, the above method for manufacturing the array substrate can set the gap or the minimum distance between the first electrode and the second electrode smaller when ensuring that the signal crosstalk is within the acceptable range, thereby greatly alleviating the decrease in light transmittance caused by the larger gap between the first electrode and the second electrode, and thus increasing the light transmittance of the array substrate. In addition, the first electrode and the insulation layer are prepared by a single patterning process, and the second electrode is prepared by another single patterning process. That is, the insulation layer, the first electrode and the second electrode are prepared by two patterning processes. Compared with the prior art, the number of patterning processes for preparing these film layers is not increased. Therefore, the method for manufacturing the array substrate according to the embodiments of the disclosure will not increase the number of process steps while bringing about the above-mentioned advantageous effects.

Embodiment of the disclosure further provides an array substrate. As shown in FIGS. 6-9C, the array substrate comprises a base substrate 3, a first electrode 6 disposed on the base substrate 3, and a second electrode 8 disposed on the base substrate 3 and located in a different layer from the first electrode, that is, a layer where the first electrode is located and a layer where the second electrode is located are different layers formed through different patterning processes, as described herein. Further, an insulation layer 5 is disposed over the first electrode 6. In some examples, the insulating layer disposed over the first electrode 6 at least covers a surface of the first electrode 6 facing away from the base substrate 3. When a voltage is applied, an electric field may be formed between the first electrode 6 and the second electrode 8. The electric field may include a horizontal electric field parallel to the base substrate 3 for driving liquid crystal molecules to be deflected. In one example, the insulation layer 5 is substantially the same in cross-section shape as the first electrode 6. In another example, the insulation layer 5 is substantially the same in cross-section size or area as the first electrode 6, or orthographic projections of the insulation layer 5 and the first electrode 6 on the base substrate are completely overlapped with each other or have substantially same shape and area.

In the above array substrate, since the insulation layer 5 and the first electrode 6 have substantially the same cross-section shape, the insulation layer 5 and the first electrode 6 can be formed in a same single patterning process. Further, since the insulation layer 5 covers the first electrode 6, the first electrode 6 thus can be formed in a different patterning process from the second electrode 8, and the first electrode 6 and the insulation layer 5 are firstly formed and the second electrode 8 is then formed. Since the first electrode 6 and the second electrode 8 can be respectively formed by two patterning processes, the gap between the first electrode 6 and the second electrode 8 is not limited by the process capability, and can be set smaller while ensuring that the first electrode and the second electrode are completely separated from each other and the signal crosstalk therebetween is limited in the acceptable range. Since the gap or minimum distance between the first electrode 6 and the second electrode 8 can be set smaller, it is possible to eliminate the problem of the lower light transmittance caused by the larger gap, thereby effectively increasing the light transmittance of the array substrate.

In addition, since the first electrode 6 and the insulation layer 5 are prepared by a single patterning process and the second electrode 8 is prepared by another patterning process, the structure of the array substrate according to the embodiments does not result in an increase in the number of patterning processes.

In one exemplary embodiment, the first electrode 6 may be a comb-like electrode and the structure thereof may be similar to that of the pixel electrode 1 shown in FIG. 1. Exemplarily, as illustrated in FIG. 8, the first electrode 6 comprises a comb teeth part 61 including a plurality of comb teeth 611 parallel to and spaced apart from each other and a comb handle part 62 disposed at one side of the comb teeth part 61 and connected with the comb teeth part. In one exemplary example, the comb handle part is substantially perpendicular to each comb tooth of the comb teeth part. The second electrode 8 may also be a comb-like electrode, and the structure thereof may be similar to the structure of the common electrode 2 as shown in FIG. 1. For example, as shown in FIG. 8, the structure of the second electrode 8 may be substantially the same as that of the first electrode 6, and also comprises a comb teeth part 81 and a comb handle part 82. In the illustrated embodiment, orthographic projections of the plurality of comb teeth 611 included in the comb teeth part 61 of the first electrode 6 on the base substrate 3 are arranged to alternate with orthographic projections of the plurality of comb teeth 811 included in the comb teeth part 81 of the second electrode 8. In the orthographic projections of the first electrode 6 and the second electrode 8 on the base substrate 3, the respective comb teeth of the first electrode 6 and the second electrode 8 are located between the comb handle part of the first electrode 6 and the comb handle part of the second electrode 8.

One of the first electrode 6 and the second electrode 8 will be applied with a common voltage signal and the data lines are applied with a pixel voltage signal, so if the respective comb teeth of the first electrode 6 and the second electrode 8 extend in a direction substantially same as an extending direction of the data lines, an electric field will be generated between the data line to which the pixel voltage signal is applied and the one of the first electrode 6 and the second electrode 8 to which the common voltage signal is applied, which causes the liquid crystal molecules at an edge of the pixel closer to the data lines to be deflected at a larger deviation from the ideal circumstances, thereby resulting in a light leakage at the edge of the pixel. In order to avoid the aforementioned light leakage, in one embodiment of the disclosure, the comb teeth of each of the first electrode 6 and the second electrode 8 extend in the direction substantially perpendicular to the extending direction of the data lines, so that the electric field formed between the date lines and the electrode (the first electrode 6 or the second electrode 8) due to the difference between the applied voltage signals is greatly reduced, thereby effectively improving the problem of the light leakage.

In an exemplary embodiment, a gap or a minimum distance between the first electrode 6 and the second electrode 8 may be set smaller. For example, a gap or minimum distance between an orthographic projection of the comb handle part of the second electrode 8 on the base substrate 3 and end portions of orthographic projections of the plurality of comb teeth included in the comb teeth part of the first electrode 6 on the base substrate 3 is less than 6 µm, and a gap or minimum distance between an orthographic projection of the comb handle part of the first electrode 6 on the base substrate 3 and end portions of orthographic projections of the plurality of comb teeth included in the comb teeth part of the second electrode 8 on the base substrate 3 may be also less than 6 µm. Therefore, it is possible to eliminate the problem of decrease in the light transmittance due to the gap.

In other embodiments, since the insulation layer 5 covers above the first electrode 6 and the first electrode 6 and the insulation layer 5 are formed prior to the second electrode 8, the orthographic projection of the comb handle part of the second electrode 8 on the base substrate 3 may be at least partially overlapped with the orthographic projections of the plurality of comb teeth included in the comb teeth part of the first electrode 6 on the base substrate 3, as shown in FIGS. 9B and 9C. Alternatively, the end portions of the orthographic projections of the plurality of comb teeth included in the comb teeth part of the second electrode 8 on the base substrate 3 are at least partially overlapped with the orthographic projection of the comb handle part of the first electrode 6 on the base substrate 3, as shown in FIGS. 9A and 9C. Alternatively, the orthographic projection of the comb handle part of the second electrode 8 on the base substrate 3 may be at least partially overlapped with end portions of the orthographic projections of the plurality of comb teeth included in the comb teeth part of the first electrode 6 on the base substrate 3, and the end portions of the orthographic projections of the plurality of comb teeth included in the comb teeth part of the second electrode 8 on the base substrate 3 are at least partially overlapped with the orthographic projection of the comb handle part of the first electrode 6 on the base substrate 3. With the above arrangements, it is possible to completely eliminate the gap between the end portions of the plurality of comb teeth included in the comb teeth part of one of the first electrode 6 and the second electrode 8 and the comb teeth part of the other so as to maximally eliminate the problem of the decrease in light transmittance caused by the gap.

It is noted that since the first electrode 6 and the insulation layer 5 have substantially the same cross-section and side surfaces of the first electrode 6 are not covered by the insulation layer 5, if orthographic projections of the first electrode 6 and the subsequently formed second electrode 8 on the base substrate 3 are overlapped with each other, the second electrode 8 may be in electrical contact with the side surface of the first electrode 6. In order to prevent the above problem from occurring, during the etching of the insulation layer 5 and the first electrode 6, an etching rate or other etching process parameters may be respectively adjusted so that the cross section size of the insulation layer 5 finally obtained by etching (including a width extending in a left-right direction in the drawings) is slightly greater than the cross section size of the first electrode 6 (including a width extending in the left-right direction in the drawing), or an area of an orthographic projection of the insulation layer 5 located on the first electrode 6 on the base substrate is slightly greater than an area of an orthographic projection of the first electrode 6 on the base substrate, as shown in FIG. 8C. In this way, a gap or distance will be formed between the subsequently formed second electrode 8 and the side surface of the first electrode 6 so that the second electrode 8 would not be brought into an electrical contact with the side surface of the first electrode 6.

As shown in FIGS. 6-7B, the array substrate according to the embodiments of the disclosure may further comprise a gate insulation layer 4 disposed below the first electrode 6 such that the gate insulation layer 4 is located below the first electrode 6 while not be located below the second electrode 8, thus a step difference is formed between the first electrode 6 and the second electrode 8, thereby improving the electrical insulation effect therebetween. Therefore, the gap or the minimum distance between the first electrode 6 and the second electrode 8 can be set smaller, which further increases the light transmittance of the array substrate. In some embodiments, an orthographic projection of the gate insulation layer 4 below the first electrode 6 on the base substrate is substantially completely overlapped with the orthographic projection of the first electrode 6 on the base substrate or has substantially the same shape and area as the orthographic projection of the first electrode 6 on the base substrate. Thus, the gate insulation layer 4 can be formed by the same patterning process as the first electrode 6. That is, the insulation layer 5, the first electrode 6 and the gate insulation layer 4 can be formed by a same patterning process, without increasing the number of patterning processes.

In the above array substrate, the first electrode 6 may be a pixel electrode and the second electrode 8 may be a common electrode. Alternatively, the first electrode 6 may be a common electrode, and the second electrode 8 may be a pixel electrode.

Another embodiment of the disclosure provides a display device comprising the array substrate as described in any one of the above embodiments. Since the gap or the minimum distance between the first electrode and the second electrode in the array substrate of the embodiment of the disclosure can be set smaller, the light transmittance of the array substrate is higher and further, the signal crosstalk between the first electrode and the second electrode is limited in an acceptable range, the display device comprising the array substrate also has the advantages of high light transmittance and signal crosstalk within the acceptable range.

It is noted that the display device according to the embodiment of the disclosure may be a liquid crystal display device. For example, the display device may include any product or part having a display function, such as a liquid crystal panel, a cell phone, a tablet computer, a television, a display, a notebook computer, a digital photo frame, a navigator, or the like.

The above described contents are merely specific embodiments of the disclosure, and the scope of the present disclosure is not limited thereto. Changes or alternations which are easily made by those skilled in the art should fall within the scope of the disclosure. Therefore, the scope of the disclosure should be solely defined by the scope of claims and equivalents thereof.

What is claimed is:

1. An array substrate, comprising:
    a base substrate;
    a first insulation layer on the base substrate;
    a first electrode on the first insulation layer; and
    a second electrode on the base substrate and located in a different layer from the first electrode;
    wherein the first electrode and the second electrode are configured to generate an electric field therebetween when being applied with a voltage,
    wherein each of the first electrode and the second electrode is a comb-like electrode comprising a comb handle part and a comb teeth part having a plurality of comb teeth, and orthographic projections of the plurality of comb teeth of the first electrode on the base substrate are arranged to alternate with orthographic projections of the plurality of comb teeth of the second electrode on the base substrate, and
    wherein the first insulation layer is disposed below the first electrode, an orthographic projection of the first insulation layer on the base substrate coincides with an orthographic projection of the first electrode on the base substrate, and an orthographic projection of at least a portion of the second electrode on the base substrate is located outside the orthographic projection of the first insulation layer on the base substrate.

2. The array substrate according to claim 1, wherein an orthographic projection of at least one of the plurality of comb teeth of the first electrode on the base substrate is located between orthographic projections of two adjacent ones of the comb teeth of the second electrode on the base substrate, and/or an orthographic projection of at least one of the plurality of comb teeth of the second electrode on the base substrate is located between orthographic projections of two adjacent ones of the comb teeth of the first electrode on the base substrate.

3. The array substrate according to claim 1, wherein a minimum distance between an orthographic projection of the comb handle part of the second electrode on the base substrate and end portions of the orthographic projections of the plurality of comb teeth of the first electrode on the base substrate is less than 6 μm, and/or a minimum distance between an orthographic projection of the comb handle part of the first electrode on the base substrate and end portions of the orthographic projections of the plurality of comb teeth of the second electrode on the base substrate is less than 6 μm.

4. The array substrate according to claim 1, further comprising a second insulation layer located over the first electrode, wherein an orthographic projection of the second insulation layer on the base substrate is completely overlapped with the orthographic projection of the electrode on the base substrate, or an area of the orthographic projection of the second insulation layer on the base substrate is slightly greater than an area of the orthographic projection of the first electrode on the base substrate.

5. The array substrate according to claim 1, wherein the first electrode and the second electrode are located on different surfaces.

6. The array substrate according to claim 1, wherein:
    one of the first electrode and the second electrode is a pixel electrode, and the other of the first electrode and the second electrode is a common electrode.

7. A display device, comprising the array substrate according to claim 1.

8. The array substrate according to claim 1, wherein the second insulation layer only covers a top surface of the first electrode, or the second insulation layer covers both a top surface and a side surface of the first electrode.

9. The array substrate according to claim 1, wherein:
end portions of the orthographic projections of the plurality of comb teeth of the first electrode on the base substrate are at least partially overlapped with the orthographic projection of the comb handle part of the second electrode on the base substrate; and/or
end portions of the orthographic projections of the plurality of comb teeth of the second electrode on the base substrate are at least partially overlapped with the orthographic projection of the comb handle part of the first electrode on the base substrate.

10. A method for manufacturing an array substrate, comprising steps of:
forming a first insulation material film on a base substrate;
forming a first conductive thin film on the first insulation material film;
patterning the first conductive thin film so as to form a pattern of a first electrode;
patterning the first insulation material film so as to form a pattern of a first insulation layer;
forming a second conductive thin film on the base substrate; and
removing, through a single patterning process, a portion of the second conductive thin film outside a second electrode region to be formed, so as to form a pattern of a second electrode,
wherein each of the first electrode and the second electrode is a comb-like electrode comprising a comb handle part and a comb teeth part having a plurality of comb teeth, and orthographic projections of the plurality of comb teeth of the first electrode on the base substrate are arranged to alternate with orthographic projections of the plurality of comb teeth of the second electrode on the base substrate; and
wherein the first insulation layer is disposed below the first electrode, an orthographic projection of the first insulation layer on the base substrate coincides with an orthographic projection of the first electrode on the base substrate, and an orthographic projection of at least a portion of the second electrode on the base substrate is located outside the orthographic projection of the first insulation layer on the base substrate.

11. The method according to claim 10, further comprising:
forming a second insulation material film on the first conductive thin film, and patterning the second insulation material film so as to form a pattern of a second insulation layer, after forming the first conductive thin film on the first insulation material film and before patterning the first conductive thin film so as to form the pattern of the first electrode.

12. The method according to claim 11, wherein the pattern of the second insulation layer is formed such that an orthographic projection of the second insulation layer on the base substrate is completely overlapped with the orthographic projection of the first electrode on the base substrate, or such that an area of the orthographic projection of the second insulation layer on the base substrate is slightly greater than an area of the orthographic projection of the first electrode on the base substrate.

13. The method according to claim 11, wherein the steps of forming the first conductive thin film on the first insulation material film, patterning the first conductive thin film so as to form the pattern of the first electrode, forming the second insulation material film on the first conductive thin film, and patterning the second insulation material film so as to form the pattern of the second insulation layer comprise:
forming the first conductive thin film and the second insulation material film on the first insulation material film sequentially; and
performing a single patterning process on the second insulation material film and the first conductive thin film so as to form the patterns of the second insulation layer and the first electrode such that the second insulation layer only covers a top surface of the first electrode.

14. The method according to claim 11, wherein the steps of forming the first conductive thin film on the first insulation material film, patterning the first conductive thin film so as to form the pattern of the first electrode, forming the second insulation material film on the first conductive thin film, and patterning the second insulation material film so as to form the pattern of the second insulation layer comprise:
forming the first conductive thin film on the first insulation material film;
performing a single patterning process on the first conductive thin film so as to form the pattern of the first electrode;
forming the second insulation material film on the base substrate so as to cover the pattern of the first electrode; and
performing another patterning process on the second insulation material film so as to form the pattern of the second insulation layer such that the second insulation layer covers both a top surface and a side surface on the first electrode.

15. The method according to claim 11, wherein:
patterning the second insulation material film so as to form the pattern of the second insulation layer comprises:
forming a photoresist layer having the same pattern as that of the first electrode to be formed over the second insulation material film; and
etching, by using the photoresist layer as a mask, a portion of the second insulation material film outside the first electrode region to be formed, so as to form the pattern of the second insulation layer; and
patterning the first conductive thin film so as to form the pattern of the first electrode comprises:
etching, by using the photoresist layer as a mask, a portion of the first conductive thin film outside the first electrode region to be formed, so as to form the pattern of the first electrode.

16. The method according to claim 15, wherein:
patterning the first insulation material film so as to form the pattern of the first insulation layer comprises:
etching, by using the photoresist layer as a mask, a portion of the first insulation material film outside the first electrode region to be formed, so as to form the pattern of the first insulation layer below the pattern of the first electrode.

17. The method according to claim 10, further comprising:
forming patterns of a gate electrode and a gate line on the base substrate by a single patterning process before forming the first conductive thin film; and
forming patterns of an active layer, a source electrode, a drain electrode and a data line on the base substrate having the pattern of the gate electrode by a single patterning process.

* * * * *

UNITED STATES PATENT AND TRADEMARK OFFICE
CERTIFICATE OF CORRECTION

| | |
|---|---|
| PATENT NO. | : 10,451,944 B2 |
| APPLICATION NO. | : 15/580637 |
| DATED | : October 22, 2019 |
| INVENTOR(S) | : Yunyun Tian, Hui Zhang and Hyun Sic Choi |

It is certified that error appears in the above-identified patent and that said Letters Patent is hereby corrected as shown below:

In the Claims

Column 14, Line 50:
Delete "the electrode"
Insert -- the first electrode --

Signed and Sealed this
Fourteenth Day of January, 2020

Andrei Iancu
*Director of the United States Patent and Trademark Office*